(12) United States Patent
Hayakawa et al.

(10) Patent No.: US 7,759,750 B2
(45) Date of Patent: Jul. 20, 2010

(54) MAGNETIC MEMORY CELL AND RANDOM ACCESS MEMORY

(75) Inventors: Jun Hayakawa, Sendai (JP); Hideo Ohno, Sendai (JP); Shoji Ikeda, Sendai (JP)

(73) Assignees: Hitachi, Ltd., Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 11/790,211

(22) Filed: Apr. 24, 2007

(65) Prior Publication Data

US 2007/0254188 A1 Nov. 1, 2007

(30) Foreign Application Priority Data

Apr. 26, 2006 (JP) ............................. 2006-122539

(51) Int. Cl.
*H01L 29/82* (2006.01)
*G11C 11/02* (2006.01)

(52) U.S. Cl. ........................ 257/421; 257/422; 438/3; 360/324.2; 365/157; 365/158; 365/171; 365/172

(58) Field of Classification Search ................ 257/2–5, 257/421–427, 30, 302, E29.323; 360/324.2, 360/324.1, 324–326, 313; 365/157–158, 365/171–173; 438/3
See application file for complete search history.

(56) References Cited

U.S. PATENT DOCUMENTS 5,640,343 A * 6/1997 Gallagher et al. ........... 365/171
5,695,864 A 12/1997 Slonczewski
6,603,677 B2 8/2003 Redon et al.
7,119,410 B2 10/2006 Saito et al.
2003/0018871 A1* 1/2003 March et al. ................. 711/173
2004/0264239 A1* 12/2004 Tsang ......................... 365/158
2006/0266470 A1* 11/2006 Koga .......................... 156/272.4

OTHER PUBLICATIONS

Stiles et al., Physical Review B 66, 014407 (2002).*
U.S. Patent Classification System Manual of Classification.*
Tulapurkar, A.A., et al., "Subnanosecond magnetization reversal in magnetic nanopillars by spin angular momentum transfer", American Institute of Physics, Applied Physics Letters, vol. 85, No. 22, Nov. 29, 2004, pp. 5358-5360.
Miyazaki, T., et al., "Giant magnetic tunneling effect in Fe/Al$_2$O$_3$/Fe junction", Elsevier Science B.V., Journal of Magnetism and Magnetic Materials 139, 1995, pp. L231-L234.
Yuasa, Shinji, et al., "Giant room-temperature magnetoresistance in single-crystal Fe/MgO/Fe magnetic tunnel junctions", Advance Online Publication, Nature Publishing Group, 2004, pp. 1-4.

* cited by examiner

*Primary Examiner*—Bradley K Smith
*Assistant Examiner*—Jami M Valentine
(74) *Attorney, Agent, or Firm*—Stites & Harbison PLLC; Juan Carlos A. Marquez, Esq.

(57) ABSTRACT

To provide a highly-reliable, low-power-consumption nonvolatile memory. A magnetization reversal of a ferromagnetic free layer is accomplished with a spin transfer torque in a state where an appropriate magnetic field is applied in a direction orthogonal to the direction of the magnetic easy axis of the ferromagnetic free layer of the tunnel magnetoresistance device that the magnetic memory cell includes. Preferably, the magnetic field is applied in a direction forming an angle of 45° with the direction perpendicular to the film plane.

5 Claims, 15 Drawing Sheets

WIDTH OF WIRING 100nm

WIDTH OF WIRING 200nm

FIG. 16

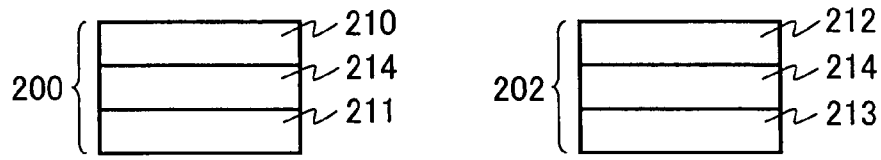

| FIRST FERROMAGNETIC FILM 210, THIRD FERROMAGNETIC FILM 212 | SECOND FERROMAGNETIC FILM 211, FOURTH FERROMAGNETIC FILM 213 |
|---|---|
| [Co(100-x)Fe(x)](100-y)B(y) 0<x<100 (%), 0<y<30 (%) (ALLOYS OF CoFeB: INCLUDING CoB AND FeB) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| Co(100-x)Fe(x) (ALLOYS OF Co, Fe: INCLUDING Fe AND Co) 0<x<100 (%) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| NiFe | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/Co(100-x)Fe(x) TWO FERROMAGNETIC LAYERS 0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/NiFe TWO FERROMAGNETIC LAYERS 0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| Co(100-x)Fe(x)/NiFe TWO FERROMAGNETIC LAYERS 0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe | reference : Applied Physics letters, Vol.85, No.22, p5359 (2004)

MAGNETIC MEMORY CELL AND RANDOM ACCESS MEMORY

CLAIM OF PRIORITY

The present application claims priority from Japanese application JP2006-122539 filed on Apr. 26, 2006, the content of which is hereby incorporated by reference into this application.

BACKGROUND OF THE INVENTION

1. Field of the Invention

The present invention relates to a magnetic memory cell and a random access memory equipped with a high-output tunnel magnetoresistance device.

2. Description of the Related Art

Attempts have been made to apply a high-output tunnel magnetoresistance device to a recording/reading cell of a highly-integrated magnetic memory. Examples that have been disclosed as such tunnel magnetoresistance devices include, a tunnel magnetoresistance device with its insulator made of Al-oxide and a tunnel magnetoresistance device with an insulating film made of magnesium oxide (T. Miyazaki and N. Tezuka, *J. Magn. Magn. Mater.* 139, L231 (1995); and S. Yuasa. et al., *Nature Material* 3, 868(2004)). In a nonvolatile magnetic memory of conventional-type, the memory cell is made up by forming a tunnel magnetoresistance device on a MOSFET. The MOSFET is used for switching to pass a current through a bit line and a word line. A current-induced, spatial magnetic field thus generated is used to rotate the magnetization direction of the tunnel magnetoresistance device to store data, while recalling data is accomplished by the output voltage of the tunnel magnetoresistance device. Besides the above-mentioned magnetization-rotation method using current-induced spatial magnetic field, another method is disclosed, for example, in the specification of U.S. Pat. No. 5,695,864, and in Japanese Patent Application Laid-open No. 2002-305337. The disclosed method is known as a spin transfer torque magnetization reversal method, in which, rotation of magnetization is accomplished by passing a current directly through a magnetoresistance device. In addition, Japanese Patent Application Laid-open No. 2005-50907 discloses a way of applying a magnetic field, in which a magnetic field is applied in a direction parallel to the magnetic easy axis direction of the ferromagnetic free layer.

SUMMARY OF THE INVENTION

There is a known fact as to the above-mentioned writing method by the spin transfer torque magnetization reversal. As FIGS. 17A to 17C show, a magnetization reversal mistakenly occurs, or does not occur, under the condition of 10-nanosecond or shorter write operation time of an ordinary memory. Such a mistake is brought about by a significant increase of the threshold current for the spin transfer torque magnetization reversal. FIG. 17A shows a chart cited from *Appl. Phys. Lett.* 85, 5358 (2004). In the chart, the reversal probability in relation to the write current is plotted. The figure shows that there are regions where the reversal probability is neither zero nor one, and that in regions of a shorter writing time, the value of write current needed to make the reversal probability one is significantly increased. FIG. 17B shows the magnitude of write current against the writing time, and shows that a writing time of 10 nanoseconds or shorter makes the write current increased. In FIG. 17C, the writing probability is plotted against the write current, and shows that there is a current range—specifically, from I1 to I2—where the writing probability is neither zero nor one.

Writing data in a magnetic memory has to be usually done within 10 nanoseconds or shorter. To obtain a low-power-consumption, highly-reliable, highly-integrated nonvolatile magnetic memory, the magnetization of a recording layer of the tunnel magnetoresistance device has to be reversed, with a low current, with certainty, with no mistake, and in such a short period of time.

An object of the present invention is to provide a magnetic memory cell and a random access memory which can satisfy such a demand.

In the present invention, a magnetization reversal of the recording layer is accomplished by the spin transfer torque while applying a magnetic field in a direction crossing, or preferably, orthogonal to the magnetic easy axis of a ferromagnetic free layer—recording layer—of a giant magnetoresistance device, or a tunnel magnetoresistance device, constituting a magnetic memory cell. The direction is ranging from perpendicular to the film plane of the ferromagnetic free layer to a direction forming an angle of 45° with the perpendicular line to the film plane. The magnetic field can be applied by passing a current through a wiring provided in parallel to the magnetic easy axis of the ferromagnetic free layer. The application of the magnetic field can be performed using a ferromagnetic wiring which is provided in parallel to the magnetic easy axis of the ferromagnetic free layer, and which has a boundary region (magnetic domain wall) where the identical magnetic poles face each other, of the respective magnetic domains with opposite directions of magnetic domains.

According to the present invention, the probability of incorrect writing can be reduced by making the current for writing by the spin transfer torque is reduced. As a result, a highly-reliable, low-power-consumption nonvolatile memory can be obtained.

BRIEF DESCRIPTION OF THE DRAWINGS

FIG. 16 shows examples of materials for the ferromagnetic free layer and the ferromagnetic pinned layer.

DESCRIPTION OF THE PREFERRED EMBODIMENT

Hereinbelow, embodiments of the present invention will be described with reference to accompanying drawings. From now on, the embodiment of the present invention will be described by an example using a tunnel magnetoresistance device as a magnetoresistance device, but the same effects can be achieved by replacing the tunnel magnetoresistance device with a giant magnetoresistance device.

Figure 1:
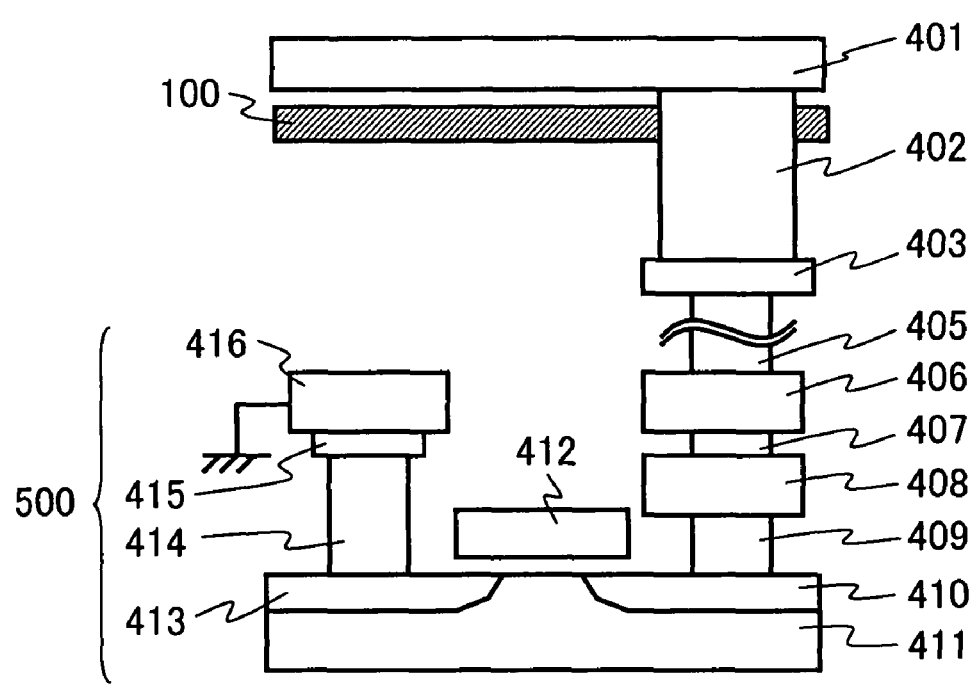
FIG. 1 is a schematic diagram showing a configuration example of a magnetic memory cell according to an embodiment of the present invention.

FIG. 1 is a schematic diagram showing a configuration example of a magnetic memory cell equipped with a tunnel magnetoresistance device according to an embodiment of the present invention. A C-MOS 500 includes two n-type semiconductors 410 and 413, and a p-type semiconductor 411. A drain electrode 414 connected to the n-type semiconductor 413 is grounded via electrodes 415 and 416. A source electrode 409 is connected to the n-type semiconductor 410. The ON/OFF control of the current passing between the source electrode 409 and the drain electrode 414 is performed by the switching ON/OFF of a gate electrode 412. The source electrode 409, on which layers of electrodes 408 to 405 are stacked, is connected to the tunnel magnetoresistance device 402 via an electrode 403. Some layers of electrodes may exist between the electrode 405 and the electrode 403. The bit line 401 is connected to the tunnel magnetoresistance device 402. Some layers of electrodes, or a protection film may be formed between the bit line 401 and the tunnel magnetoresistance device 402.

The magnetic memory cell of the embodiment of the present invention further includes a wiring 100 to generate a spatially magnetic field in a position of the ferromagnetic free layer of the tunnel magnetoresistance device. The wiring 100 is arranged, as will be described later, with reference to the position of the ferromagnetic free layer in the tunnel magnetoresistance device 402. When data are written in the magnetic memory cell, the gate electrode 412 is turned ON with the spatially magnetic field generated from the wiring 100 being applied to the ferromagnetic free layer of the magnetic memory cell. Thus, a current to generate a spin transfer torque flows through the tunnel magnetoresistance device 402 between the bit line 401 and the electrode 403. The spin transfer torque is generated by passing a current through the tunnel magnetoresistance device that a ferromagnetic free layer 200, an insulating barrier layer 201 and a ferromagnetic pinned layer 202 constitute, and has an effect of reversing the magnetization of the ferromagnetic free layer 200. Reading data is accomplished by detecting a tunnel magnetoresistance effect produced by the relative angle that the magnetization direction of the ferromagnetic free layer 200 forms with the ferromagnetic pinned layer 202.

FIGS. 2A and 2B schematically show the main portion of the magnetic memory cell shown in FIG. 1. FIG. 2A is a plan schematic diagram, while FIG. 2B is a cross-sectional schematic diagram taken along the line B-B in FIG. 2A. In the illustrated example, the tunnel magnetoresistance device 402 made up of the ferromagnetic pinned layer 202, the insulating barrier layer 201 and the ferromagnetic free layer 200 is stacked on the electrodes 406 to 403. A protection electrode film 401, which serves also as the bit line, is formed on the ferromagnetic free layer 200. The stacking sequence of the ferromagnetic free layer 200 and the ferromagnetic pinned layer 202 may be reversed. The wiring 100 to generate a spatially magnetic field in the position of the ferromagnetic free layer 200 is arranged with reference to the ferromagnetic free layer 200.

Figure 2:
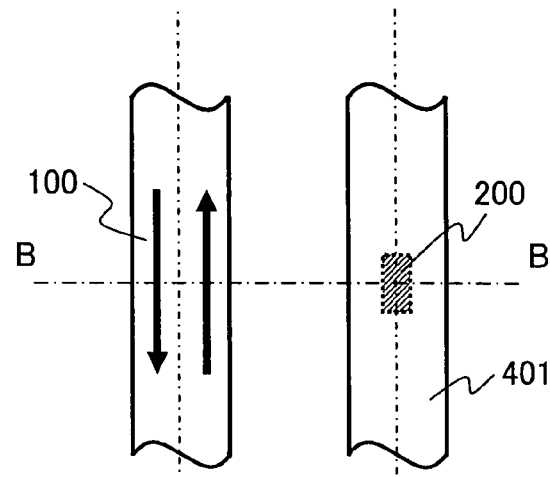
FIGS. 2A and 2B are schematic diagrams showing a main portion of the magnetic memory cell shown in FIG. 1.
Figure 2:
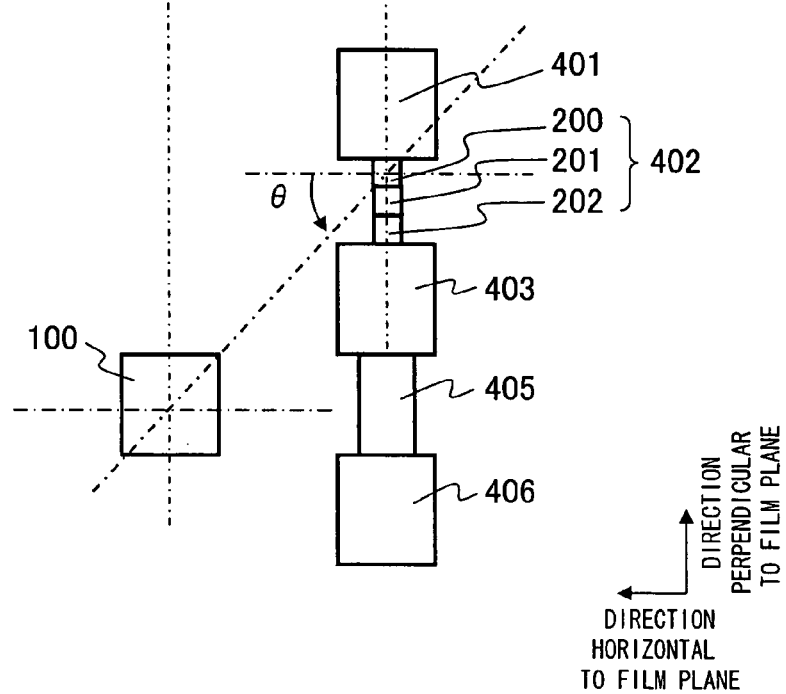
Figure 3:
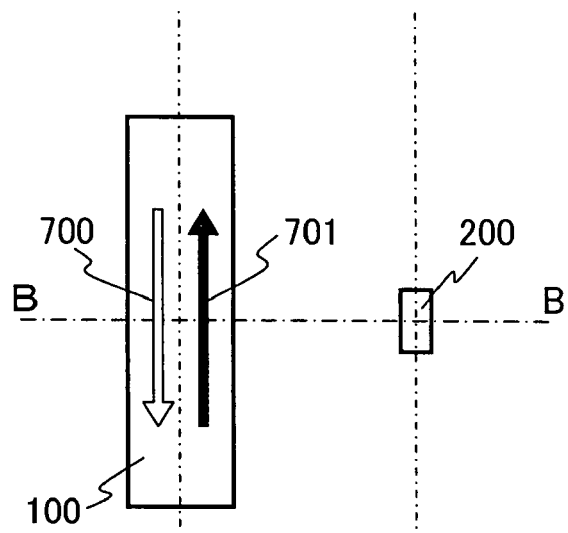
FIGS. 3A and 3B show an example of the positional relationship between a ferromagnetic free layer and a wiring.
Figure 3:
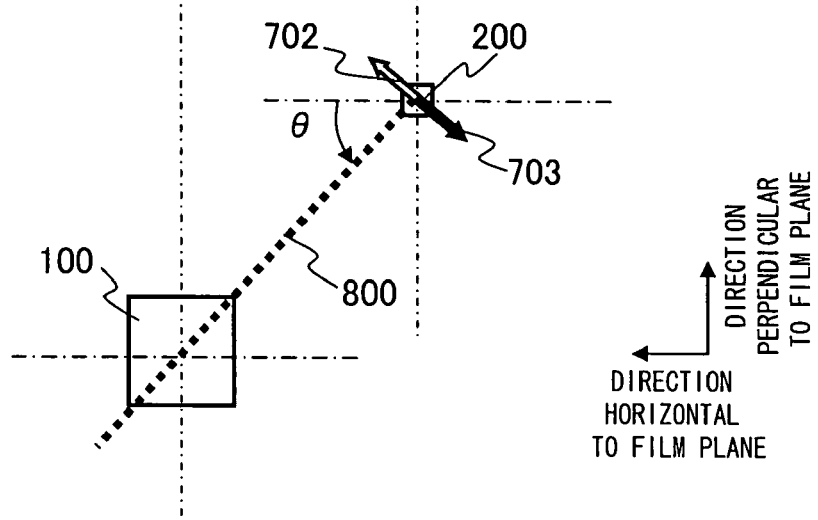

FIGS. 3A and 3B schematically show a part of FIGS. 2 and 2B, specifically, the ferromagnetic free layer 200 constituting the tunnel magnetoresistance device, and the wiring 100 to generate a spatially magnetic field by applying a current. FIG. 3A is a plan schematic diagram, while FIG. 3B is a cross-sectional schematic diagram taken along the line B-B in FIG. 3A.

The wiring 100 is arranged in parallel to the direction of the magnetic easy axis of the ferromagnetic free layer 200, which is, in this case, in parallel to the long axis direction of the ferromagnetic free layer 200. In addition, the wiring 100 is arranged in a direction to form an angle θ vertically downwards with respect to the film plane of the ferromagnetic free layer 200. The angle θ here can be selected from a range between 0° and 90°, but the most preferable is that a line 800 connecting the center in cross section of the wiring 100 and the center in cross section of the ferromagnetic free layer 200 in FIG. 3B makes an angle of 45° with the film plane of the ferromagnetic free layer 200. Such arrangement of wiring 100 with θ=45° can significantly reduce the write current by the spin transfer torque, and thus can reduce the incidence of erroneous writing. When a current is passed through the wiring 100, a magnetic field is applied to the ferromagnetic free layer 200. The relationship between the direction of the current passing through the wiring 100 and the direction of the magnetic field applied to the ferromagnetic free layer 200 is shown in FIGS. 3A and 3B. When a current flows in a direction indicated by an arrow 700, a magnetic field applied to the ferromagnetic free layer 200 has a direction indicated by an arrow 702. In contrast, a current in a direction indicated by an arrow 701 makes the applied magnetic field to have a direction indicated by an arrow 703.

Figure 4:
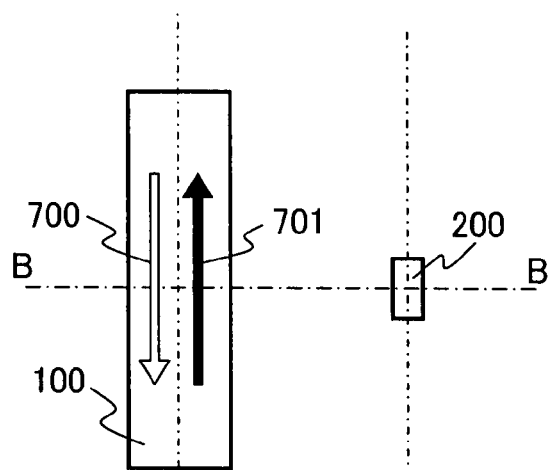
FIGS. 4A and 4B show another example of the positional relationship between the ferromagnetic free layer and the wiring.
Figure 4:
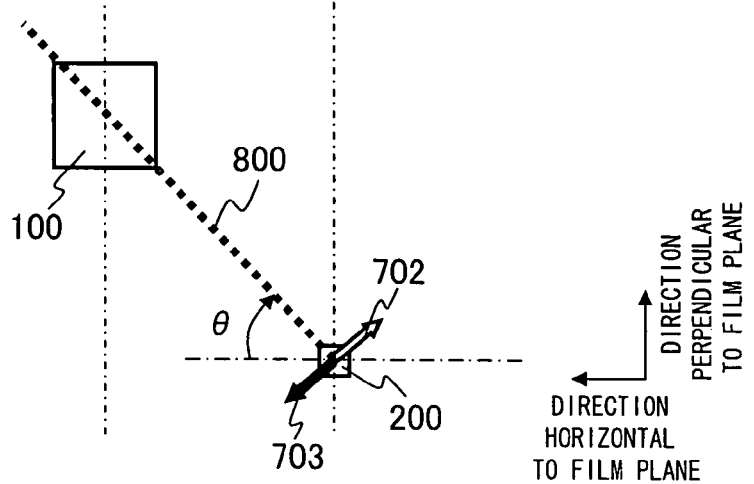

It should be noted that, though in the example shown in FIG. 1, FIGS. 2A and 2B, and FIGS. 3A and 3B, the wiring 100 is arranged lower in the vertical direction than the film plane of the ferromagnetic free layer 200, the wiring 100 may be arranged, as shown in FIGS. 4A and 4B, upper in the vertical direction than the film plane of the ferromagnetic free layer 200 with an angle θ. Here, FIGS. 4A and 4B correspond to FIGS. 3A and 3B. FIG. 4A is a plan schematic diagram, while FIG. 4B is a cross-sectional schematic diagram taken along the line B-B in FIG. 4A.

Figure 5:
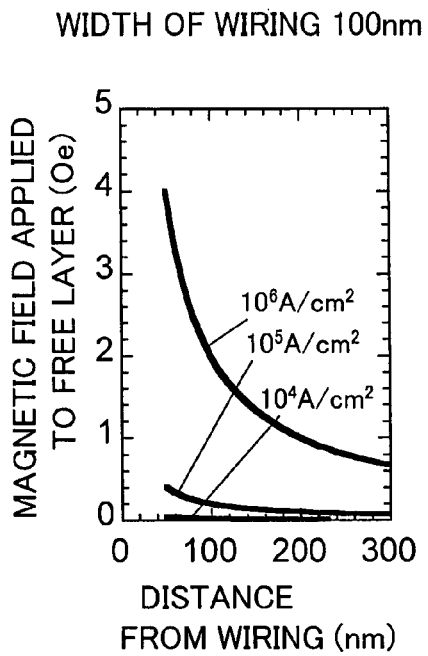
FIGS. 5A and 5B show the relationship between the distance from the wiring to the ferromagnetic free layer, and the magnitude of a magnetic field applied to the ferromagnetic pinned layer.
Figure 5:
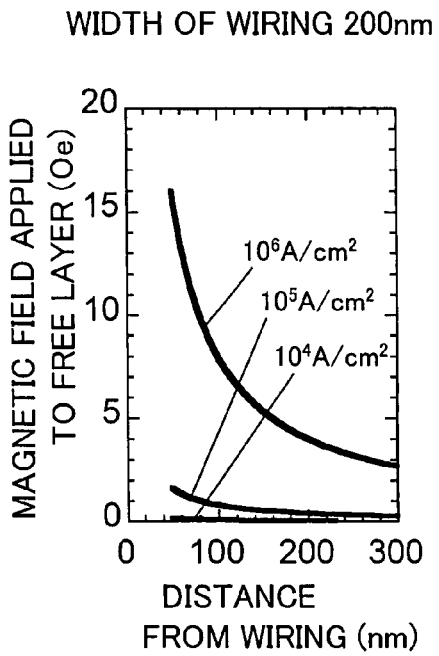

FIGS. 5A and 5B show the relationship between the distance from the wiring 100 to the ferromagnetic free layer 200 and the magnitude of the magnetic field applied to the ferromagnetic free layer 200. FIG. 5A shows the relationship in a case where the width of the wiring 100 is 100 nm, while FIG. 5B shows the relationship in the case of the wiring 100 with a 200-nm width. In each of the FIGS. 5A and 5B, the density of the current passing through the wiring 100 is varied from $10^4$ A/cm$^2$ to $10^6$ A/cm$^2$. A larger magnetic field is applied to the ferromagnetic free layer 200, with a shorter distance from the wiring 100, a larger current density, and a larger width of the wiring 100.

Figure 6:
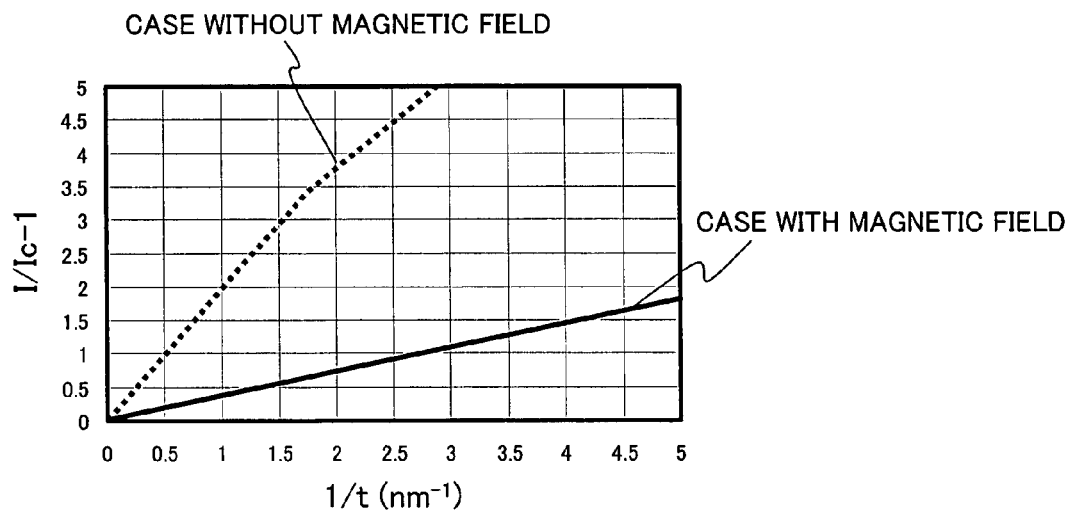
FIG. 6 shows the relationship between the write current and the writing time.

The magnetic field generated from the wiring 100 is applied together with the write current when the writing operation using the spin transfer torque magnetization reversal of the ferromagnetic free layer 200. In FIG. 6, the magnitude of the write current is plotted against the length of write-current application both in a case where the magnetic field is applied and in a case where no magnetic field is applied. In FIG. 6, I is the write current, Ic is the threshold current, and t is a period of time when the current is applied. The applied magnetic field has one-tenth magnitude of the anisotropic magnetic field of the ferromagnetic free layer 200. The magnitude of the applied magnetic field is preferably smaller than the anisotropic magnetic field. For example, when the write current is applied for one nanosecond, the write current can be reduced by half with the magnetic field applied from the write current with no magnetic field applied. With the magnetic field applied, the shorter the application time of the magnetic field is, the larger the reduction of write current becomes. In addition, the probability of the magnetization reversal by the spin transfer torque is improved with an application of the magnetic field, to be twice as large as the probability of the case with no magnetic field applied.

Now, descriptions will be provided for the reason why a reduction in probability of erroneous writing and a reduction in write current for the spin transfer torque magnetization reversal can be achieved by passing the write current with a magnetic field being applied to the ferromagnetic free layer as in the case of the embodiment of the present invention. In an ordinary case of writing by magnetization reversal using an external magnetic field, the external magnetic field is applied in a direction parallel to the magnetization direction of the ferromagnetic free layer (particularly in parallel to the magnetic easy axis), and, at the same time, is applied in a direction where the magnetization is intended to be oriented. This is because the magnetization is inherently oriented to the direction of the external magnetic field. In contrast, the spin transfer torque magnetization reversal has a different characteristic, which will be described with reference to FIGS. 7A to 7C.

Figure 7:
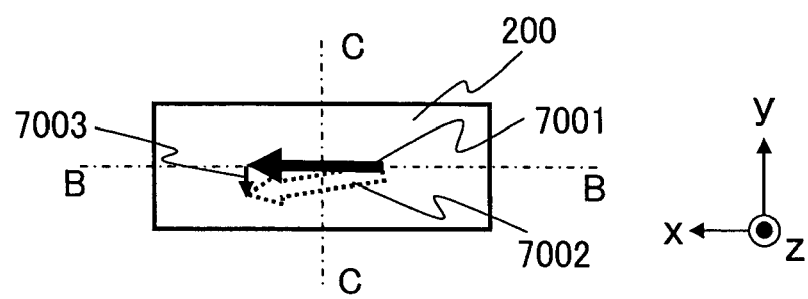
FIGS. 7A to 7C are diagrams for describing the principle of the spin transfer torque magnetization reversal.
Figure 7:
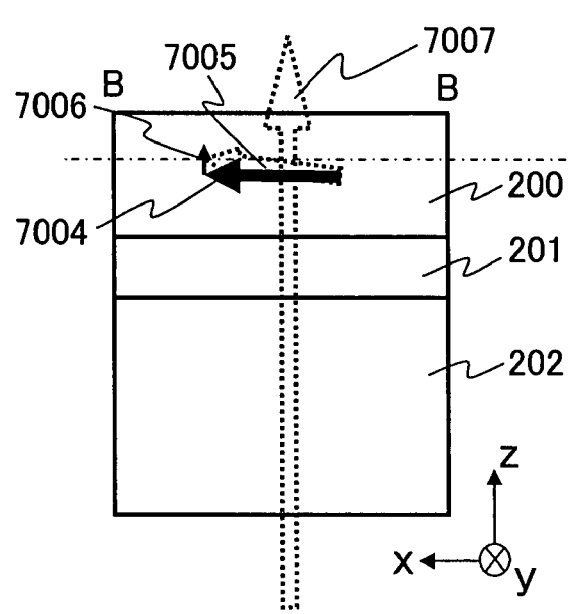
Figure 7:
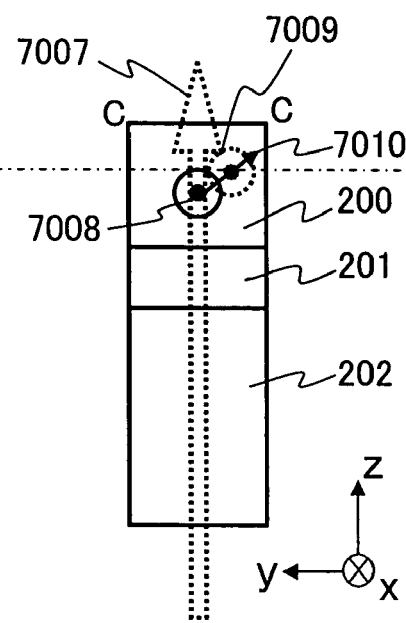

FIGS. 7A to 7C show a tunnel magnetoresistance device constituting a magnetic memory cell. FIG. 7A is a top plan view, FIG. 7B shows a cross section taken along the line B-B in FIG. 7A, and FIG. 7C shows a cross section taken along the line C-C in FIG. 7A. In FIGS. 7A to 7C, the x-direction is the longitudinal direction of the ferromagnetic free layer 200 or the direction of the magnetic easy axis of the layer 200. Meanwhile, the y-direction is a direction perpendicular to the longitudinal direction of the ferromagnetic free layer 200, or to the direction of the magnetic easy axis of the layer 200. The z-direction is a direction perpendicular to the film plane of the ferromagnetic free layer 200. In the spin transfer torque magnetization reversal, a write current 7007 is applied in the direction perpendicular to the film plane of the ferromagnetic free layer 200. In the case shown in FIGS. 7A to 7C, the magnetization of the ferromagnetic free layer 200 in the initial state is oriented to the x-direction. A magnetization 7001 in the x-direction, has a direction component of a magnetization direction 7001 on the xy-plane, of a magnetization direction 7004 on the xz-plane, and a magnetization direction 7008 on the yz-plane. Now, when the write current 7007 is applied, the magnetization direction 7001 on the xy-plane, the magnetization direction 7004 on the xz-plane, and the magnetization direction 7008 on the xz-plane rotate respectively in the magnetization reversal directions 7003, 7006 and 7010 which are to be the magnetization direction 7002, 7005 and 7009. In other words, the magnetization oriented in the x-direction on the film plane begins to rotate in a direction so as to have a vector component in each of the y-direction and the z-direction. Accordingly, an application of a magnetic field in a direction of a space that the magnetization reversal directions 7003, 7006 and 7010 compose helps a smooth spin transfer torque magnetization reversal. The write current threshold for the spin transfer torque magnetization reversal can be reduced, and, with the magnetic field, the magnetization rotation can be excited to a direction with certainty. In this embodiment of the present invention, the angle θ shown in FIG. 3B is made to align with the direction of the space that the magnetization reversal directions 7003, 7006 and 7010 compose.

Figure 8:
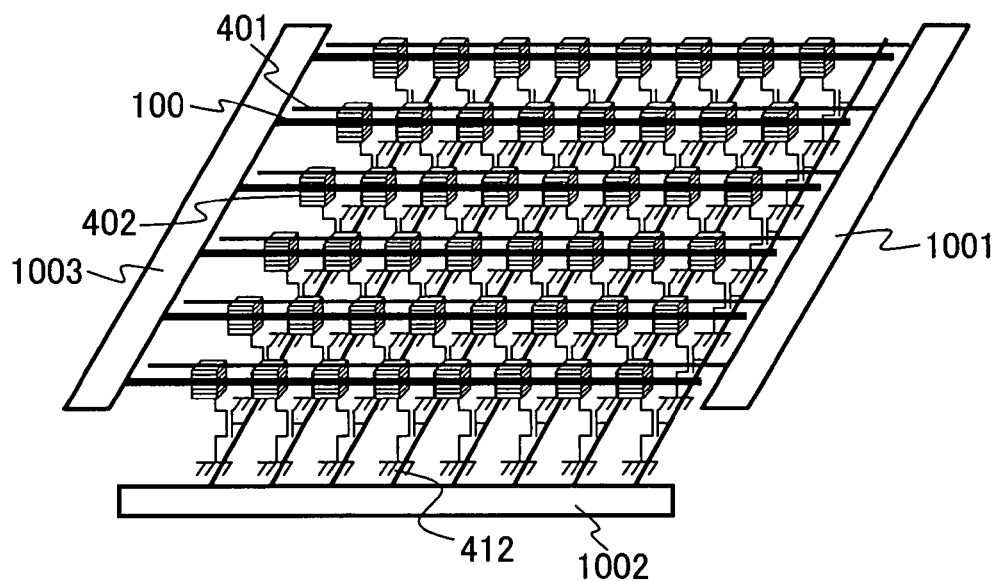
FIG. 8 shows a configuration example of a magnetic random access memory according to another embodiment of the present invention.

FIG. 8 shows a configuration example of a magnetic random access memory according to an embodiment of the present invention, which magnetic random access memory is made up of a plurality of magnetic memory cells shown in FIG. 1 arranged in an array. Gate electrodes 412 and bit lines 401 are electrically connected to memory cells. A bit line driver 1001 is provided to control the bit lines 401, while a gate driver 1002 is provided to control the gate electrodes 412.

As has been described before, the wiring 100 is arranged, in each magnetic memory cell, with reference to the position of the ferromagnetic pinned layer of the tunnel magnetoresistance device 402. In this embodiment, the wirings 100 are arranged in parallel to the bit lines 401. In addition, a driver for controlling wiring to generate magnetic field 1003 is provided to control the application of current to the wirings 100. When data are written to the ferromagnetic pinned layer of the tunnel magnetoresistance device constituting each of the magnetic memory cells by the spin transfer torque magnetization reversal, a current is applied to the wirings 100 to apply a magnetic field to the ferromagnetic free layer of each of the magnetic memory cells in which writing data has to be performed. A preferable way of applying a current to the wirings 100 is an application performed concurrently with the writing and for the same length of time as the writing, but the current may be applied constantly. The width of each wiring 100 is preferably equal to 100 nm or less. By setting the width of the wiring 100 at 100 nm, a magnetic random access memory with a gigabit class capacity can be obtained.

Figure 9:
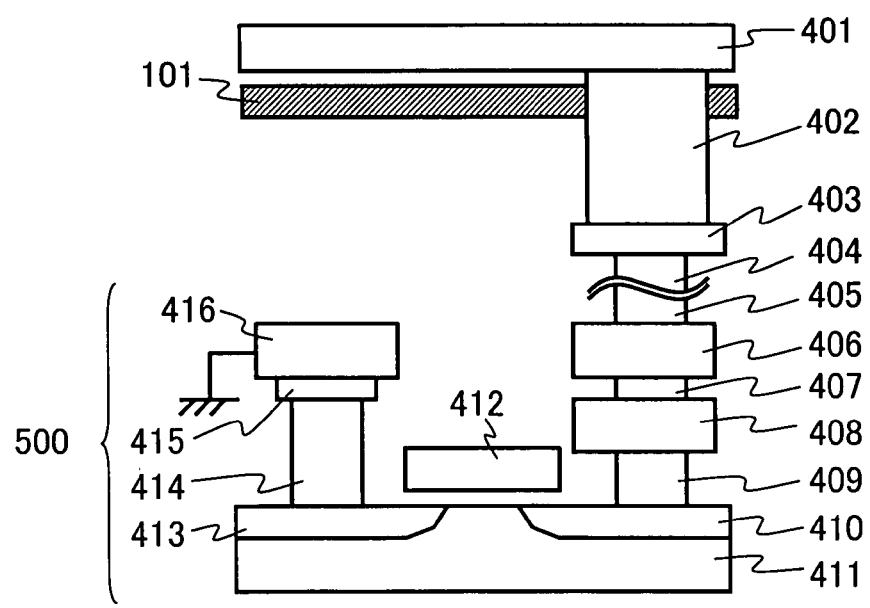
FIG. 9 shows another configuration example of a magnetic memory cell according to still another embodiment of the present invention.

FIG. 9 shows another configuration example of a magnetic memory cell according to another embodiment of the present invention. The magnetic memory cell in this embodiment differs from the magnetic memory cell shown in FIG. 1 in its replacement of the wiring 100 with a ferromagnetic layer 101. The ferromagnetic layer 101 is arranged with reference to the position of the ferromagnetic free layer of the tunnel magnetoresistance device 402, and has two regions with magnetization directions opposite each other. The ferromagnetic layer 101 applies a spatially magnetic field generated from the boundary region (magnetic domain wall) between the magnetizations of the opposite directions to the ferromagnetic free layer of the tunnel magnetoresistance device 402.

FIGS. 10A and 10B schematically show the main portion of the magnetic memory cell shown in FIG. 9. FIG. 10A is a plan schematic diagram, while FIG. 10B is a cross-sectional schematic diagram taken along the line B-B in FIG. 10A. In the illustrated example, a tunnel magnetoresistance device 402 that a ferromagnetic pinned layer 202, an insulating barrier layer 201 and a ferromagnetic free layer 200 constitute is stacked on electrodes 406 to 403. A protection electrode film 401, which serves also as a bit line of the magnetic memory cell, is formed on the ferromagnetic free layer 200. It should be noted that the stacking sequence of the ferromagnetic free layer 200 and the ferromagnetic pinned layer 202 may be reversed.

FIGS. 11A and 11B schematically show the ferromagnetic free layer 200 and the ferromagnetic layer 101, which constitute the tunnel magnetoresistance device taken out from FIGS. 10A and 10B. FIG. 11A is a top schematic diagram, while FIG. 11B is a cross-sectional schematic diagram taken along the line B-B in FIG. 11A.

The ferromagnetic layer 101 is arranged in parallel to the direction of magnetic easy axis of the ferromagnetic free layer 200, that is, in parallel to the direction of the long axis of the ferromagnetic free layer 200, in this case. In addition, the ferromagnetic layer 101 has two domains 102 and 103 with magnetization directions opposite each other, while in a boundary region 104, the N poles of the magnetic poles of each domain face each other. A radial leakage magnetic field is generated from the boundary region 104. The boundary region 104 is arranged so as to be at a certain angle with the film plane of the ferromagnetic free layer 200 in a direction between the direction horizontal to the film plane and the direction vertical to the film plane. In other words, as FIG. 11B shows, the boundary region 104 is arranged so that a line 802 connecting the center of the cross section of the ferromagnetic free layer 200 and the center of the plane of the boundary region 104 where N poles in the ferromagnetic layer 101 face each other can make an angle θ with the film plane of the ferromagnetic free layer 200. With this arrangement of the ferromagnetic layer 101 and of the boundary region 104, the leakage magnetic field 708 generated from the boundary region 104 is applied to the ferromagnetic free layer 200 in a direction with an angle θ. A preferable angle θ is 45°, but an angle not less than 0° and not more than 90° can bring about the effect. It should be noted that the boundary region 104 can be moved by appropriately applying a current to the ferromagnetic layer 101.

Now, refer back to FIG. 9. Writing magnetic data in the magnetic memory is accomplished by a magnetization reversal method using a spin transfer torque, that is, by passing a current between a protection electrode film and an electrode 406 while a magnetic field is applied from the ferromagnetic layer 101 to the ferromagnetic free layer 200 of the tunnel magnetoresistance device 402. The spin transfer torque is generated by applying a current to the tunnel magnetoresistance device that the ferromagnetic free layer 200, the insulating barrier layer 201 and the ferromagnetic pinned layer 202 constitute, and has an effect of reversing the magnetization of the ferromagnetic free layer 200. On the other hand, reading data is accomplished by using a tunnel magnetoresistance effect produced by the relative angle that the magnetization direction of the ferromagnetic free layer 200 forms with the ferromagnetic pinned layer 202.

The magnetic field generated from the boundary region 104 is preferably applied when the writing operation is performed by the spin transfer torque magnetization reversal of the ferromagnetic free layer 200, but the magnetic field may be applied constantly. There is a difference between the write current needed for the spin transfer torque magnetization reversal at the time when a leakage magnetic field from the boundary region 104 of the ferromagnetic layer 101 is applied to the ferromagnetic free layer 200, and the write current at the time when the magnetic field is not applied. The difference is similar to the case of using the spatially magnetic field from the wiring, and has a relationship shown in FIG. 6. For example, when a write current is applied for one nanosecond, the write current can be reduced by half with the magnetic field applied from the write current with no magnetic field applied. With the magnetic field applied, the shorter the application time is, the larger the reduction of write current becomes. In addition, the probability of the magnetization reversal by the spin transfer torque is improved with an application of the magnetic field in comparison to the case with no magnetic field applied.

Figure 10:
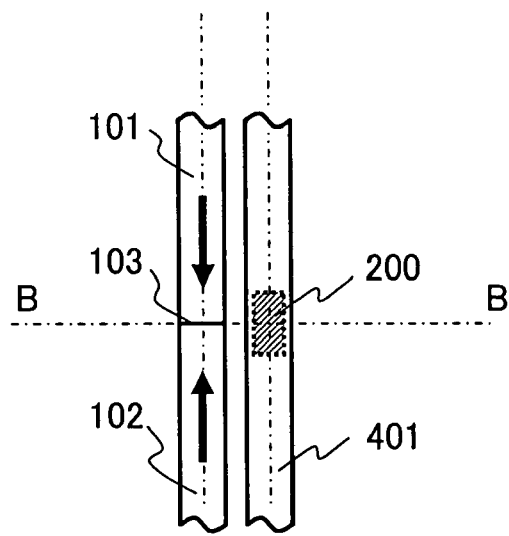
FIGS. 10A and 10B are schematic diagrams showing a main portion of the magnetic memory cell.
Figure 10:
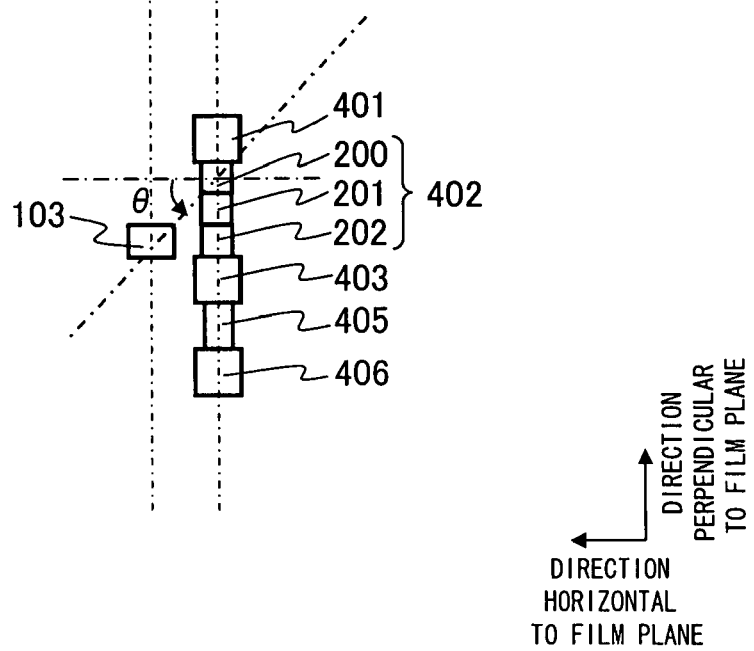
Figure 11:
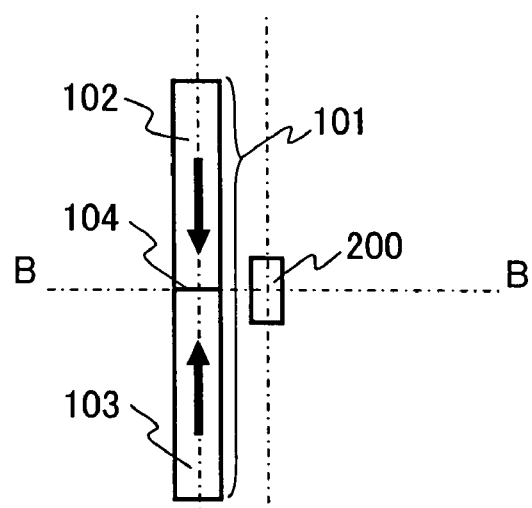
FIGS. 11A and 11B schematically show an example of the positional relationship between the ferromagnetic free layer and the ferromagnetic layer.
Figure 11:
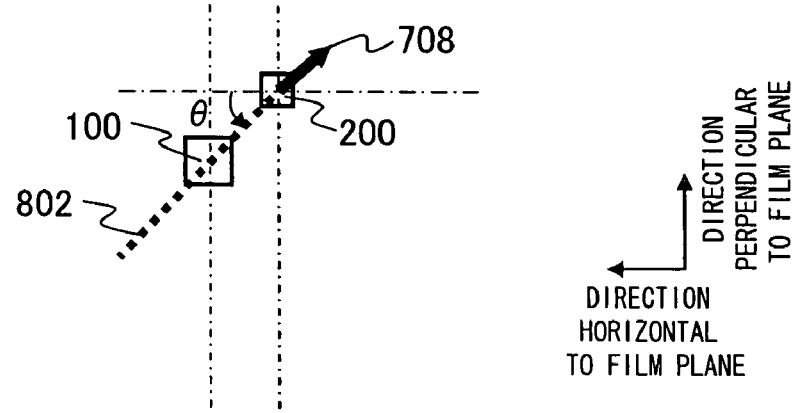
Figure 12:
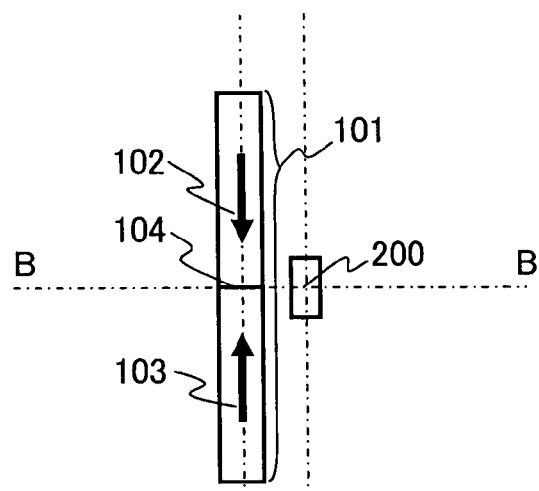
FIGS. 12A and 12B schematically show another example of the relationship between the ferromagnetic free layer and the ferromagnetic layer.
Figure 12:
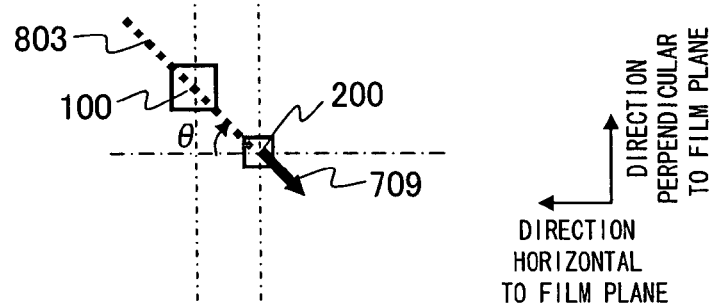

In the example described in FIGS. 10 and 11, the ferromagnetic layer 101 is arranged in a position lower in the vertical direction than the film plane of the ferromagnetic free layer 200. The same effects can be obtained by arranging the ferromagnetic layer 101 in a position upper in the vertical direction than the film plane of the ferromagnetic free layer 200 so as to form an angle θ as FIGS. 12A and 12B show. Here, FIGS. 12A and 12B correspond to FIGS. 11A and 11B. FIG. 12A is a plan diagram, FIG. 12B is a cross-sectional diagram taken along the line B-B in FIG. 12A.

Figure 13:
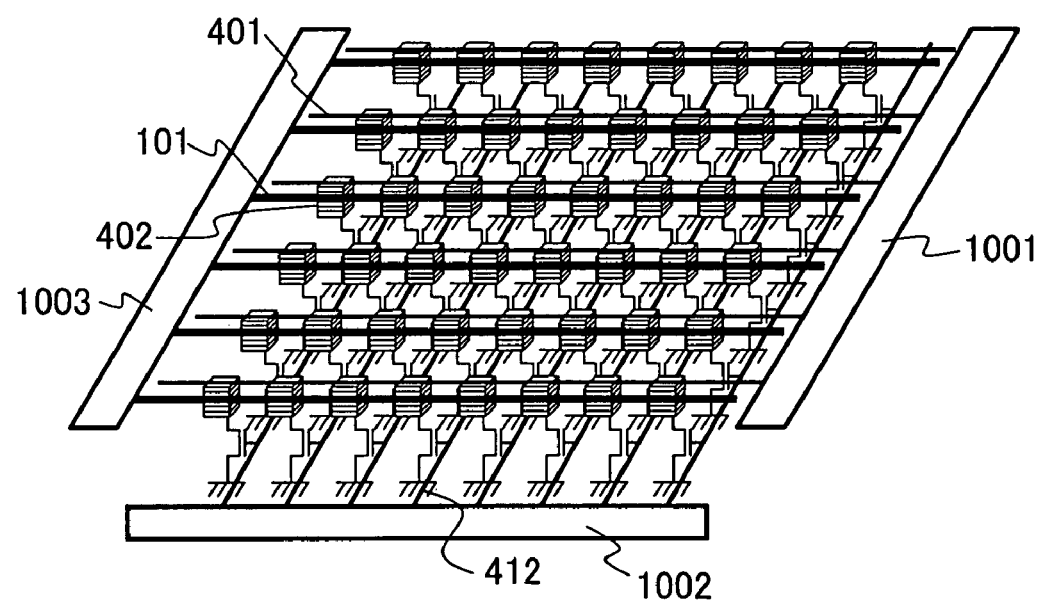
FIG. 13 shows a configuration example of a magnetic random access memory according to another embodiment of the present invention.

FIG. 13 shows a configuration example of a magnetic random access memory according to an embodiment of the present invention, which magnetic random access memory is made up of a plurality of magnetic memory cells shown in FIG. 9 arranged in an array. Gate electrodes 412 and bit lines 401 are connected to the magnetic memory cells. A bit line driver 1001 is provided to control the signal current passing through bit lines 401, while a gate driver 1002 is provided to control the signal current passing through the gate electrodes 412. Each of the ferromagnetic layers 101 in this embodiment is arranged in parallel to the bit lines 401. When data are written, by spin transfer torque magnetization reversal, in the ferromagnetic free layer of the tunnel magnetoresistance device constituting each magnetic memory cell, the boundary region between magnetizations in the ferromagnetic layer 101 is moved to the position of the magnetic memory cell, and then the magnetic field generated from the boundary region between magnetizations is applied to the ferromagnetic free layer. A driver for controlling wiring to generate magnetic field 1003 is provided to control the application of current to move the boundary region between magnetizations in the ferromagnetic layer 101. The width of each of the wirings 100 is preferably 100 nm or less. By setting the width of the wiring 100 at 100 nm, a magnetic random access memory with a gigabit class capacity can be obtained.

Now, descriptions will be given, with reference to FIGS. 14A to 14D, as to an example of data writing operation in the magnetic random access memory shown in FIG. 13. FIGS. 14A to 14D are schematic plan diagrams showing, by taking out, the ferromagnetic layer 101 and the ferromagnetic free layer of the magnetic memory cell.

In FIGS. 14A to 14D, reference numerals 2001 to 2007 show the ferromagnetic free layers included in the magnetic memory cell. The ferromagnetic layer 101 includes regions 102 and 103 with magnetizations opposite each other, and the N poles of the two magnetization regions 102 and 103 in the ferromagnetic layer 101 face each other at the boundary region 104. Each of the arrows in FIGS. 14A to 14D shows a magnetization direction.

Figure 14:
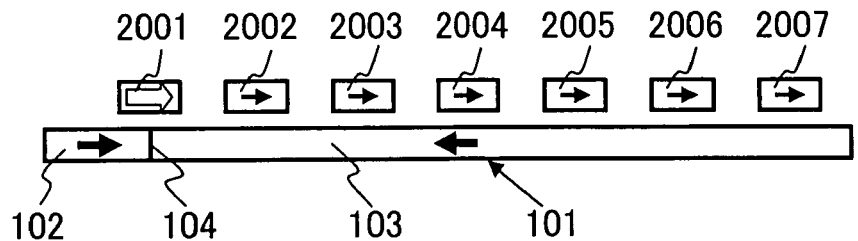
FIGS. 14A to 14D show examples of a writing operation in a magnetic random access memory according to another embodiment of the present invention.
Figure 14:
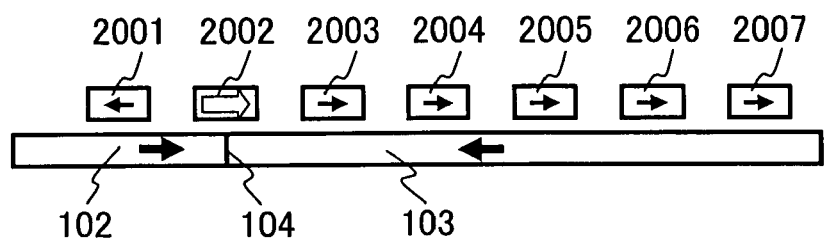
Figure 14:
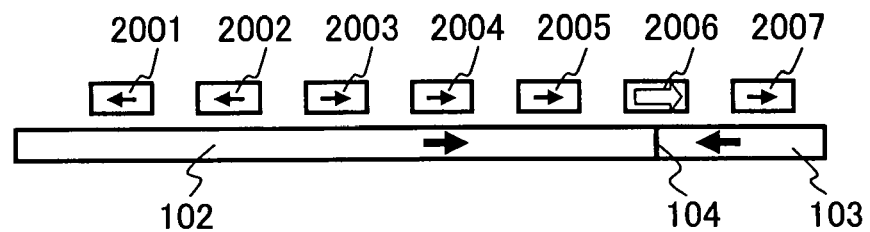
Figure 14:
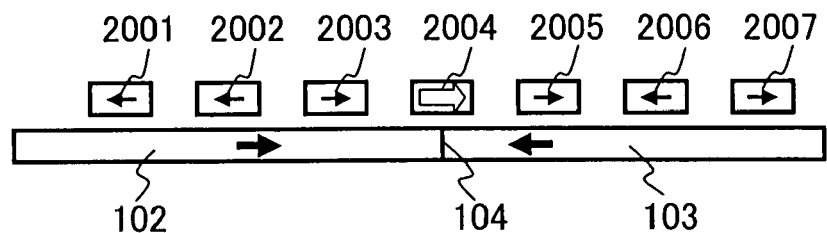

Suppose that, as FIG. 14A shows, data are initially recorded in the ferromagnetic free layer 2001 to 2007. FIG. 14A shows the state immediately before the ferromagnetic free layer 2001 is reversed. The boundary region 104 of the ferromagnetic layer 101 is in a position to apply a leakage magnetic field to the ferromagnetic free layer 2001. In this state, the write current is passed through the tunnel magnetoresistance device to which the ferromagnetic free layer 2001 belongs. Accordingly, the magnetization of the ferromagnetic free layer 2001 is reversed with certainty as the ferromagnetic free layer 2001 shown in FIG. 14B by a spin transfer torque generated by a small write current with the help of the leakage magnetic field (stray magnetic field) that the boundary region 104 of the ferromagnetic layer 101 applies.

The boundary region 104 between the magnetizations in the ferromagnetic layer 101 moves in a direction opposite the direction of the current passing through the ferromagnetic layer 101. The movement of the boundary region 104 is controlled by controlling the direction, the application time, and the density of the current passing through the ferromagnetic layer 101. The direction of the current is set at a direction opposite the direction in which the boundary region 104 is intended to move. When the application time is set, the fact that the moving speed of the boundary region 104 is at approximately 100 m/s with a current applied to the ferromagnetic layer 101 should be taken into account. For example, when the boundary region 104 is intended to move by 200 nm, the current is to be applied for two nanoseconds. Meanwhile, the current density should be in the order of $10^8$ A/cm$^2$.

Subsequently, when the magnetic data in the ferromagnetic free layer 2002 are intended to be rewritten, a current flowing towards the left in the figure is applied to the ferromagnetic layer 101, and thus the boundary region 104 between magnetizations is moved to the position of the ferromagnetic free layer 2002 as FIG. 14B shows. At the same time, a write current is applied to the tunnel magnetoresistance device to which the ferromagnetic free layer 2002 belongs, and, with the spin transfer torque thus generated, the magnetization of the ferromagnetic free layer 2002 is reversed. Furthermore, when the magnetic data in the ferromagnetic free layer 2006 are intended to be rewritten, a current flowing towards the left in the figure is applied to the ferromagnetic layer 101, the boundary region 104 between magnetizations in the ferromagnetic layer 101 is moved to the position where a leakage magnetic field is applied to the ferromagnetic free layer 2006, as FIG. 14C shows. At the same time, a write current is applied to the tunnel magnetoresistance device to which the ferromagnetic free layer 2006 belongs, and, with the spin transfer torque thus generated, the magnetization of the ferromagnetic free layer 2006 is reversed. Finally, when the magnetic data in the ferromagnetic free layer 2004 are intended to rewrite the magnetic data, a current flowing towards the right in the figure is applied to the ferromagnetic layer 101, the boundary region 104 between magnetizations is moved to the position where the leakage magnetic field is applied to the ferromagnetic free layer 2004, as FIG. 14D shows. the tunnel magnetoresistance device At the same time, the write current is applied to the tunnel magnetoresistance device to which the ferromagnetic free layer 2004 belongs, and by the spin transfer torque thus produced, the magnetization of the ferromagnetic free layer 2004 is reversed.

Figure 15:
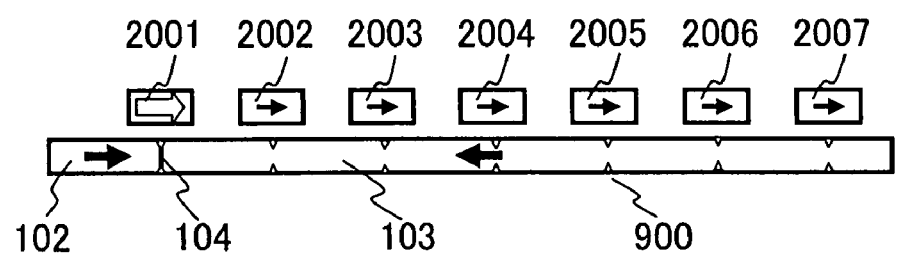
FIG. 15 shows an example of a ferromagnetic layer in which constricted portions are formed.
Figure 17:
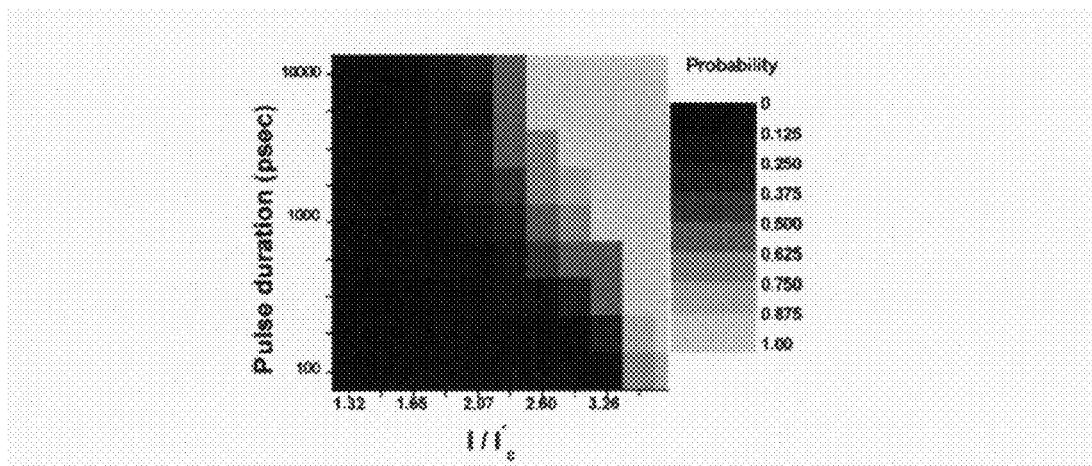
FIGS. 17A to 17C are charts for describing some problems that the writing method using spin transfer torque magnetization reversal has.
Figure 17:
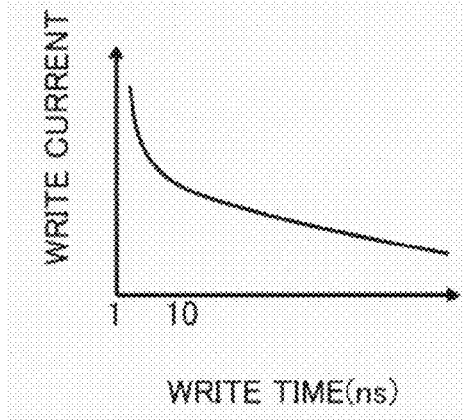
Figure 17:
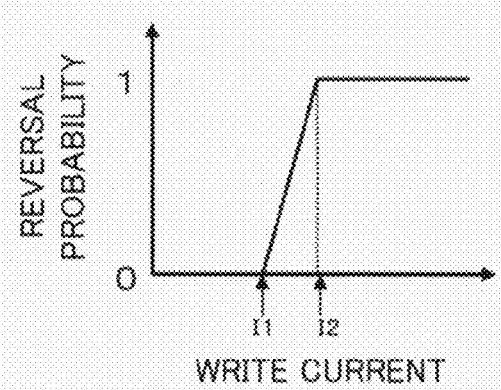

For the purpose of controlling the position of the boundary region 104 with more certainty, as FIG. 15 shows, a constriction portion 900 that has a smaller width than that of the ferromagnetic layer 101 is preferably formed in a position where the boundary region 104 is intended to be stopped. The constriction portions 900 are preferably formed in the ferromagnetic layer 101 so as to correspond to all the positions of the ferromagnetic pinned layer in the magnetic random access memory.

FIG. 16 shows examples of the materials used for a ferromagnetic free layer 200 and a ferromagnetic pinned layer 202, which are used for the magnetic memory cells of the embodiment of the present invention. For the ferromagnetic free layer 200 and the ferromagnetic pinned layer 202, magnetic materials such as CoFeB, CoFe, CoB, CoFe, Co, Fe, NiFe or the like can be used as a single layer. In addition, a first ferromagnetic free layer 210 and a second ferromagnetic layer 211 in the ferromagnetic free layer 200, as well as a third ferromagnetic layer 212 and a fourth ferromagnetic layer 213 in the ferromagnetic pinned layer 202 may be formed in accordance with the combinations of materials shown in FIG. 16. Then, the layers thus selected may be formed into a three-layered structure with an intermediate layer 214 such as Ru or the like that is coupled in an anti-parallel manner. Materials such as magnesium oxide, aluminum oxide and silicon oxide can be used for the insulating barrier layer 201.

Descriptions have been made thus far as to the embodiments in which a tunnel magnetoresistance device is used as the magnetoresistance device 402 that constitutes the magnetic memory cell. In a case where the tunnel magnetoresistance device is replaced with a giant magnetoresistance device, the insulating barrier layer 201 is replaced with a non-magnetic conductive layer.

According to the embodiments of the present invention, a highly-reliable, low-power consumption nonvolatile memory can be obtained, and a gigabit-class high-density magnetic memory can also be obtained.

What is claimed is:

1. A magnetic memory cell comprising:
   a magnetoresistance device which includes, a non-magnetic film, a ferromagnetic free layer; and a ferromagnetic pinned layer formed as sandwiching the non-magnetic film with the ferromagnetic free layer;
   an electrode for applying a write current in a film-thickness direction of the magnetoresistance device, the film-thickness direction being from the ferromagnetic pinned layer to the ferromagnetic free device or from the ferromagnetic free layer to the ferromagnetic pinned layer, the write current causing a spin transfer torque; and
   a ferromagnetic wiring arranged in parallel to a magnetic easy axis of the ferromagnetic free layer, and having a boundary region where a magnetic pole of a magnetic domain with a first magnetization direction faces the same magnetic pole of a second magnetic domain with a second magnetization direction opposite to the first direction, the magnetic easy axis of the ferromagnetic free layer being parallel to the film plane,
   wherein data is written or rewritten by applying the write current to the magnetoresistance device in a state where a magnetic field generated from the boundary region of the ferromagnetic wiring is applied to the ferromagnetic free layer, and then by reversing magnetization of the ferromagnetic free layer with the spin transfer torque.

2. The magnetic memory cell according to claim 1, wherein the non-magnetic film is made of an insulating film.

3. The magnetic memory cell according to claim 1, wherein the ferromagnetic wiring is arranged in a position shifted in a direction perpendicular to a plane including the film plane of the ferromagnetic free layer.

4. The magnetic memory cell according to claim 1, further comprising a switching device that performs ON/OFF control of a current passing through the magnetoresistance device.

5. The magnetic memory cell according to claim 4, wherein the magnetic memory cell has a transistor.

* * * * *